United States Patent [19]

Siemon et al.

[11] Patent Number: 5,542,549
[45] Date of Patent: Aug. 6, 1996

[54] CROSS CONNECT FRAME FOR COMMUNICATION CONNECTOR BLOCKS AND OTHER DEVICES

[75] Inventors: John A. Siemon, Woodbury; Christopher H. Cox, Tolland, both of Conn.

[73] Assignee: The Siemon Company, Watertown, Conn.

[21] Appl. No.: 343,242

[22] Filed: Nov. 22, 1994

[51] Int. Cl.⁶ .................................................. A47F 5/00
[52] U.S. Cl. ............................ 211/26; 211/189; 248/27.1; 312/257.1; 361/829
[58] Field of Search ...................... 211/26, 189; 361/829, 361/807, 809, 810; 312/257.1; 248/27.1

[56] References Cited

U.S. PATENT DOCUMENTS

| | | | |
|---|---|---|---|
| 2,740,944 | 4/1956 | Harrison et al. | 361/829 X |
| 3,274,451 | 9/1966 | Laity | 361/829 X |
| 4,470,102 | 9/1984 | DeLuca et al. | 361/829 X |
| 4,473,166 | 9/1984 | Breiter | 312/257.1 X |
| 4,641,754 | 2/1987 | Hebel et al. | 211/26 |
| 5,284,254 | 2/1994 | Rinderer | 211/26 |

*Primary Examiner*—Robert W. Gibson, Jr.
*Attorney, Agent, or Firm*—Fishman, Dionne & Cantor

[57] ABSTRACT

A lightweight extremely versatile cross-connect frame and associated stand-off brackets are presented. This cross-connect frame comprises few components with integrally designed hole patterns to retain communication connector blocks and other standard products that require the dimensions of an EIA standard relay rack. The enhanced manufacturing and assembly produce clean sturdy frames which can be mounted either directly or with compatible stand-off brackets to a wall or 19" EIA relay rack. Additionally, these frames, with or without stand-off brackets, minimize the mounting space required by being both an even RMS (Rack Mount Space) in length and end stackable.

15 Claims, 4 Drawing Sheets

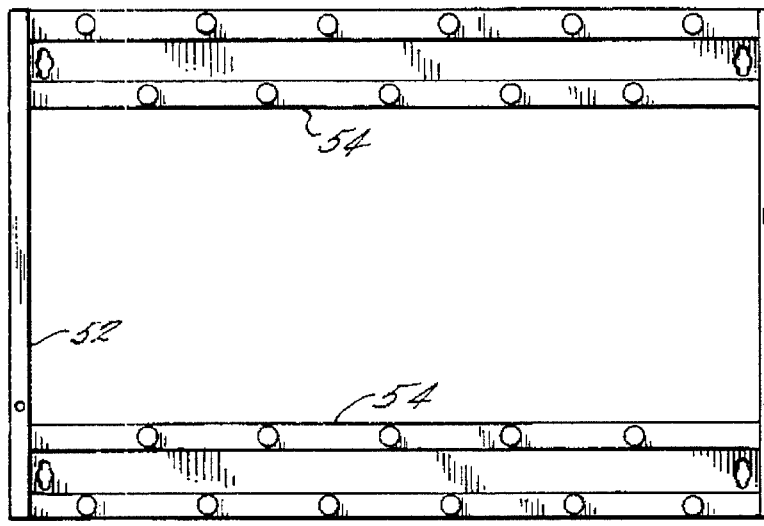
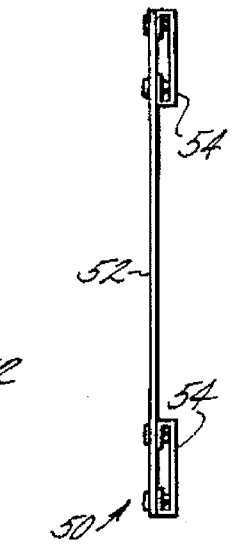
FIG. 1 (PRIOR ART)
FIG. 2 (PRIOR ART)
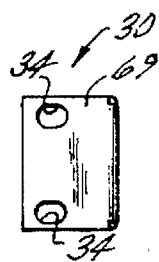
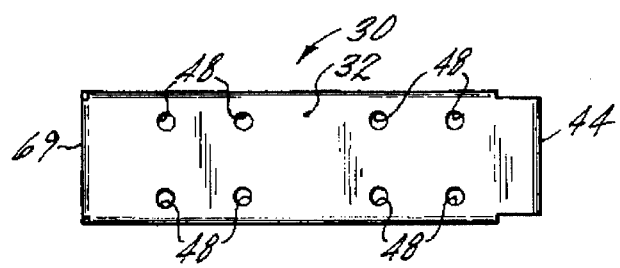
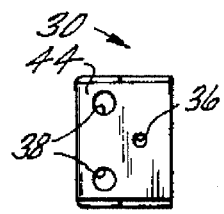
FIG. 10
FIG. 7
FIG. 8
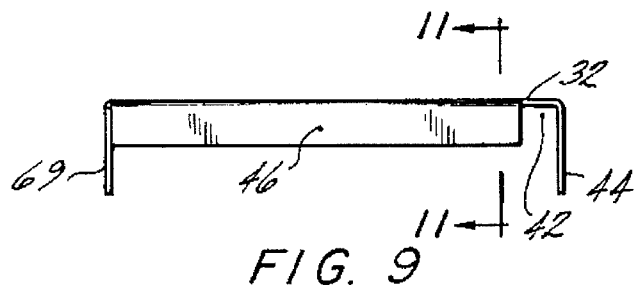
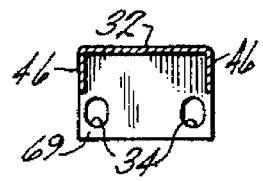
FIG. 9
FIG. 11

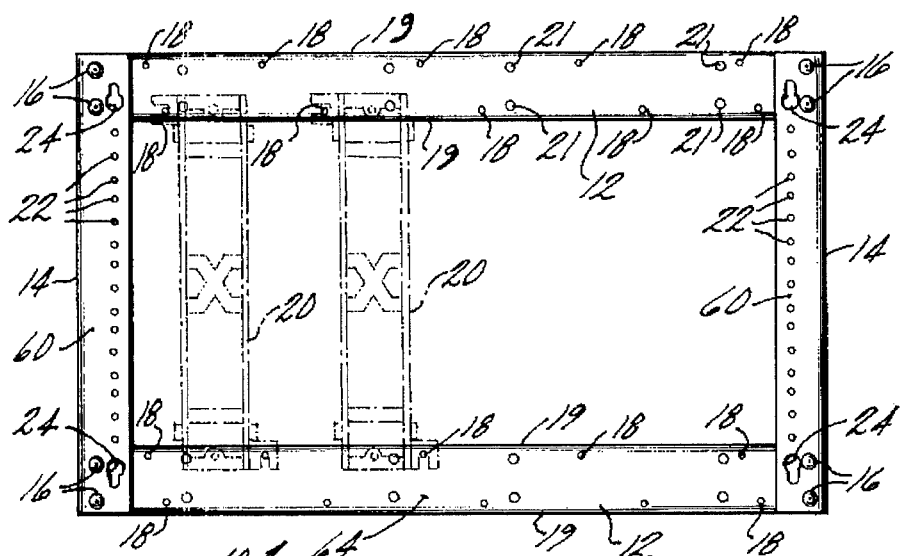
FIG. 3    FIG. 4
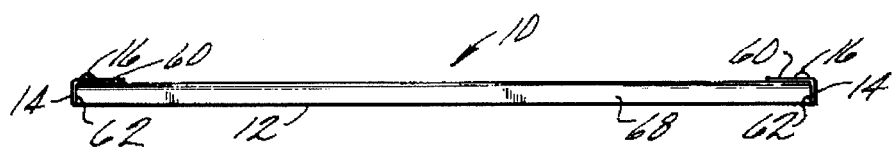
FIG. 5
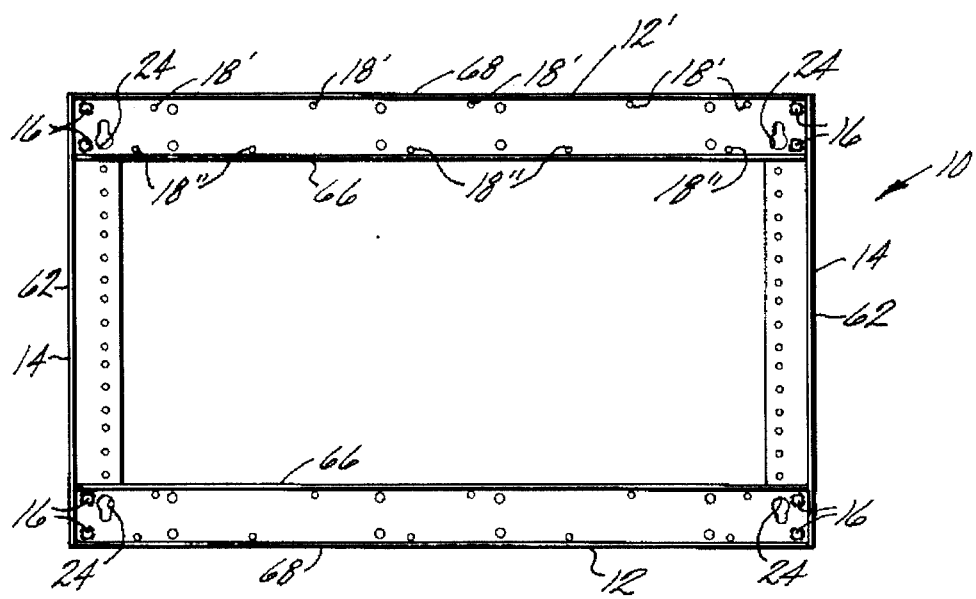
FIG. 6

CROSS CONNECT FRAME FOR COMMUNICATION CONNECTOR BLOCKS AND OTHER DEVICES

BACKGROUND OF THE INVENTION

This invention relates generally to communication connection devices. More particularly, this invention relates to a new and improved cross connect flame which is designed to emulate an EIA/TIA standard relay rack and which will accept a wide variety of connector blocks and other standard products.

EIA/TIA stands for Electronic Industry Association/Telecommunications Industries Association. This is the standards organization that, among numerous other activities, specializes in the electrical and functional characteristics of interface equipment. EIA/TIA sets standards for interfaces to ensure compatibility between data communications equipment and data terminal equipment.

Typical prior art cross-connect frames (formerly known as Intermediate Distribution Frames or IDF's) have been available and sold in several sizes to accommodate various numbers of terminal blocks as required by the situation. It will be recognized that this can be accomplished in several ways. An exemplary list of products, presently commercially available, include Mod-Tap, Harris-Dracon, and the present versions of the Siemon intermediate distribution frames. As technology merits, new and more innovative methods for managing communication systems and networks are required.

The Mod-Tap versions of the cross-connect frames are lightweight, clean in appearance and are flush mountable. Although these frames benefit from essentially one-piece construction, a substantial amount of material is wasted in their construction; thus creating an economically undesirable condition. Additionally, these frames do not utilize stand-off brackets and accommodate only 66 style terminal blocks.

The Harris-Dracon series of frames are more rugged than the other frames presently available. This is a direct result of the material used and the welding assembly technique. Unfortunately, this results in extended manufacturing and assembly periods as well as excessive costs. The high number of components also contributes to the substantially increased weight. Wire management capabilities are available but have to be built into the frames as they are being assembled. The same is true for their stand-off brackets. Finally, these frames also only accommodate 66 style terminal blocks.

The old style Siemon company® frames are wall or rack mountable, can be used with stand-off brackets, are lightweight and inexpensive. However, these frames occupy an uneven RMS and therefore, are not end stackable, wasting valuable space. Additionally, despite the relative ease of manufacture and assembly, several different components are required. Finally, these frames are also constructed to accommodate 66 style connector blocks only.

While these cross-connect frames have had wide use, there are substantial drawbacks and deficiencies exhibited. For example (1) a significant physical limitation that is shared by all of the above described frames is its ability to only handle 66 style connector blocks. The industry standard "110" type connector blocks or other standard rack mountable panels are not accommodated; (2) none of these frames have vertical hole spacing on the sides of the frame to accept rack mountable equipment and panels; (3) manufacturing and assembly is either time consuming, costly or both. Component quantity is traded for material waste; and (4) stand-off brackets are either not available, must be welded in during assembly or occupy an uneven RMS; thereby wasting space. Additionally, of the available stand-offs, not all accommodate side cable management for vertical cable runs.

SUMMARY OF THE INVENTION

The above discussed and other problems and deficiencies of the prior art are overcome or alleviated by the lower cost and more widely adaptable cross connect frame of the present invention. In accordance with the present invention, a lower cost, intermediate distribution frame is comprised of only two unique structural components per assembly as opposed to the three or more individual structure components used in the prior art. The improved cross connect frame (CCF) of this invention emulates an EIA standard relay rack and accepts the "66" connector block as well as the "110" connector block panels along with a multiplicity of rack mountable panels and other devices. This is accomplished through the use of the standard hole spacing on the sides of the CCF, as well as overall dimensions and openings that correspond to increments of 1.75" (44.5 mm); the standard rack mounting unit specified by ANSI/EIA-310, entitled Racks, Panels and Associated Equipment. Additionally, wire management capabilities are available on the frames regardless of the product(s) installed thereon.

Along with the CCF of the present invention, an improved stand-off bracket is provided. The improved stand-off bracket of this invention accepts wire management products for side wire management while mounting in less space than the prior art stand-off bracket which is a critical consideration in enclosed areas. The improved CCF, in accordance with the present invention, promotes improved appearance and workmanship over the prior art. In addition, the cost of assembly is reduced because the open backside of the structural members allows more time and cost efficient fabrication and assembly of the CCF. Moreover, because the structural members are either "U"-shaped or "L"-shaped, a more rigid assembly is provided.

The above-discussed and other features and advantages of the present invention will be appreciated and understood by those of ordinary skill in the art from the following detailed discussion and drawings.

BRIEF DESCRIPTION OF THE DRAWINGS

Referring to the drawings, wherein like elements are numbered alike in the several FIGURES:

FIG. 1 is a plan view of the prior art cross-connect frame (hereinafter referred to as CCF);

FIG. 2 is a right side elevation view of the prior art CCF of FIG. 1;

FIG. 3 is a plan view of the CCF in accordance with the present invention;

FIG. 4 is a right side elevation view of the CCF device of FIG. 3;

FIG. 5 is a bottom side elevation view of the CCF device of FIG. 3;

FIG. 6 is a back-side plan view of the CCF device of FIG. 3;

FIG. 7 is a plan view of the stand-off bracket in accordance with the present invention;

FIG. 8 is a right side elevation view of the stand-off bracket device of FIG. 7;

FIG. 9 is a bottom side elevation view of the stand-off bracket device of FIG. 7;

FIG. 10 is a left side elevation view of the stand-off bracket device of FIG. 7;

FIG. 11 is a cross-sectional elevation view along the line 11—11 of FIG. 9;

DESCRIPTION OF THE PREFERRED EMBODIMENT

Figure 12:
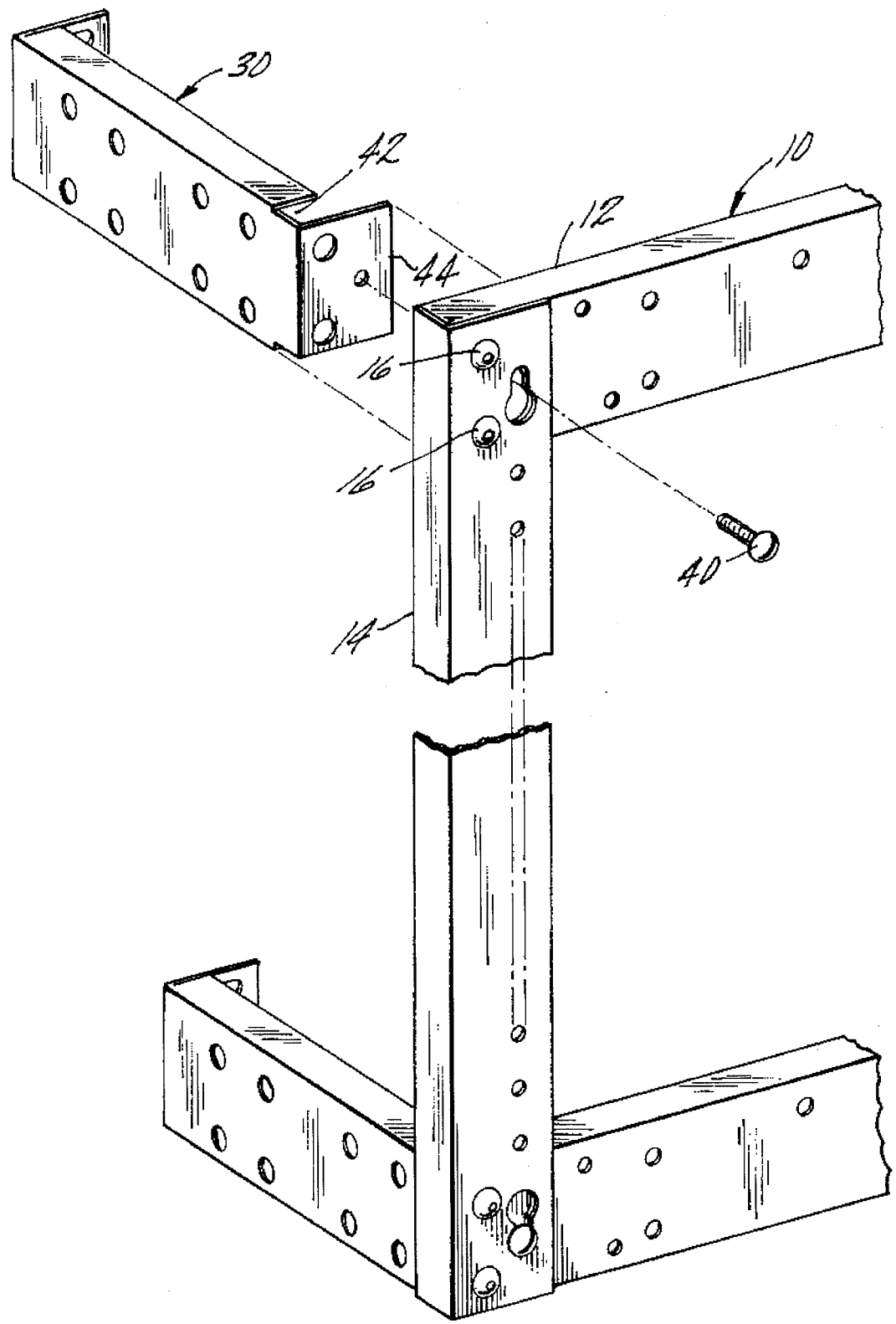
FIG. 12 is an exploded perspective partial view of the CCF device of FIG. 3 and a stand-off bracket device of FIG. 7 and a second stand-off bracket device in the lower left corner assembled in perspective view.

Referring first to FIGS. 3–6, the cross connect frame (hereinafter referred to as CCF) in accordance with the present invention is shown generally at 10. CCF assembly 10 has a generally rectangular configuration and is comprised of two main elements, a top and bottom, identical U-shaped structural member 12 and an identical left side and right side L-shaped structural member 14. The U-shaped and L-shaped members 12, 14 respectively, are fabricated in a known manner and are comprised preferably of 10 gage extruded aluminum (1.63 mm) and provided with an anodized finish. The result is a lightweight durable and aesthetically pleasing product. Of course, any other suitable metallic or non-metallic material may be used. In the preferred embodiment, eight assembly rivets 16, or like fasteners, assembled in a known manner complete the assembly 10 (preferably with two fasteners 16 being positioned at each corner). In the assembled frame 10, the two U-shaped members are mutually parallel and arranged 180 degrees apart with respect to one another, as are the two L-shaped members with the respective U-shaped and L-shaped members being respectively transversely attached to each other. The L-shaped members 14 are defined by a flat front surface 60 having lips 62 and 68 extending from the front surface at about 90 degrees. Similarly, the U-shaped members 12 are defined by a flat front surface 64 having opposed longitudinal edges and a lip 66, 68 extending from each of the opposed edges at about 90 degrees. Lips 66, 68 of U-shaped members 12 are of equal height and are lower in height compared to lip 62, by approximately the material thickness of 64, such that the corners of frame 10 are characterized by each lip 62 of L-shaped member being flush against the respective longitudinal ends of each U-shaped member.

A multiplicity of holes are provided through structural members 12 in order to mount up to five terminal block brackets or the like for standard "66" blocks, two of which are shown at 20 in phantom in FIG. 3. It should be noted that there are a number of other standard components which can be mounted in lieu of the aforementioned brackets 20 such as the "66" blocks themselves (in various configurations). Holes 18 have a diameter of 4.3 mm (0.17") and are positioned along the respective edges 19 of each structural member 12.

Holes 18' are offset from holes 18" on member 12 in FIG. 6. Each member 12 also includes a series of openings 21 having a diameter of 0.190" which are similarly provided along the respective edges 19 of structural member 12. However, unlike holes 18, openings 21 are mutually aligned relative to adjacent edges 19. Openings 21 are sized and spaced for the purpose of mounting standardized 110 wiring blocks and/or 110 wire manager devices.

In addition, there are a multiplicity of holes 22 located in both left and right structural members 14 which (hole spacing) conforms to the dimensional requirements established in ANSI/EIA-310. Four key-hole shaped standard mounting holes 24 combined with appropriate fasteners (not shown) allow the CCF to be mounted flush to a wall, on a standard 19" relay rack or on stand-off brackets as shown in FIGS. 7–12.

Referring now to FIGS. 7–12, the stand-off bracket in accordance with the present invention is generally shown at 30. Stand-off bracket 30 is comprised of a rectangular one piece member having flat front piece 32 with four sides or flaps at about 90 degrees to front face 32 including end flaps 44, 69 and side flaps 46. FIG. 10 depicts slotted holes 34 on end flap 69 for fastening the stand-off bracket 30 to a relay rack, wall or other surfaces. In FIG. 8, there is one mounting hole 36 and two assembly holes 38 which will permit the two CCF 10 assembly rivets 16 to pass through. Mounting hole 36 will accept a suitable fastener 40 (see FIG. 12) to form a rigid assembly of CCF 10 and stand-off bracket 30. As "space" 42 is large enough and the width of 44 narrow enough to allow structural member 12 to slip over spade 42 so that flange 44 of the stand-off bracket 30 will fit between structural member 12 of CCF 10 and structural member 14 of CCF 10. This snug fit will provide support against twisting and rocking and when coupled with fastener 40 will help maintain a rigid and rugged assembly. FIG. 11 is a cross-section taken along line 11—11 of the stiffening rib or flap of stand-off bracket 30. Holes 48 are suitable for side mounted wire managers used in management of vertical cable runs.

Figures 13, 14:
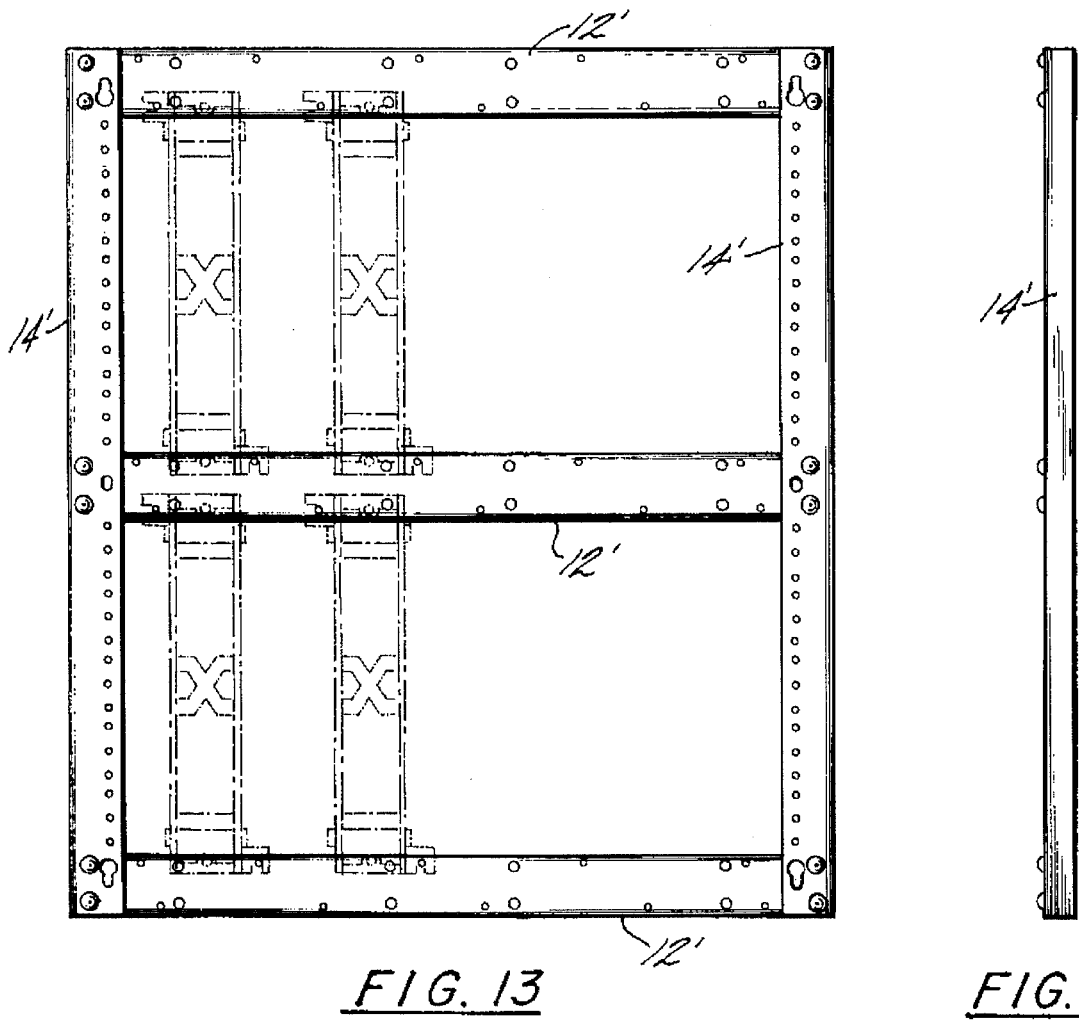
FIG. 13 is a plan view of an alternate embodiment of the CCF device of FIG. 3.
FIG. 14 is a right side elevation view of the alternate embodiment device of FIG. 13.
Figure 15:
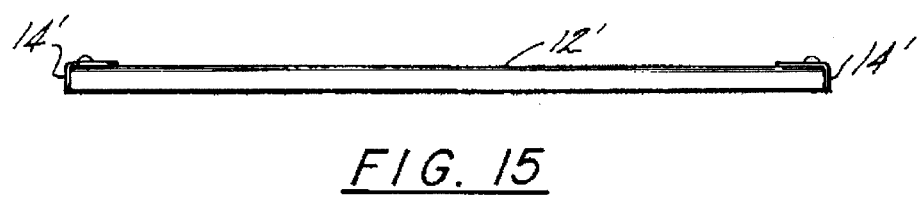
FIG. 15 is a bottom elevation view of the alternate embodiment device of FIG. 13.

FIGS. 13–15 depict an alternative embodiment of the CCF of FIG. 3. This alternative embodiment is capable of mounting twice the number of components of the preferred embodiment. However, it should be noted that structural member 12' is identical to structural member 12 of FIG. 3 which means that structural member 12 is interchangeable with the structural member 12' of FIG. 13. Therefore, the only additional structural member that would have to be newly stocked is structural member 14' which is similar to structural member 14 (see FIG. 3) except for length. It should also be noted that this alternative CCF still occupies an even RMS on standard 19" relay racks and is also, therefore, end stackable. This alternative embodiment CCF can be used with the same stand-off bracket which is in compliance with the present invention stand-off bracket as shown in FIG. 12, again occupying an even RMS.

Referring now to FIGS. 1 and 2, the prior art IDF (Intermediate Distribution Frame) is depicted generally at 50. It should be noted that new industry standards dictate the term IDF (Intermediate Distribution Frame) is no longer used. Presently such standards refer to such a device as a cross connect frame or CCF. Prior art IDF 50 has many drawbacks and deficiencies relative to the CCF of the present invention. For example, there are no holes in side brackets 52. In addition, side bracket 52 is a flat, relatively narrow member which neither has sufficient space for EIA standard 19" rack hole generation nor sufficient structural rigidity. In addition, structural members 54 are fabricated or formed such that there is not sufficient space to use the quick and easy assembly rivets 16 or the like as in FIG. 3. Still further drawbacks include their appearance and excess space requirements because of the prior art's uneven rack mount space (known as RMS). This means that prior an frame did not allow end stackability. The new CCF in accordance with the present invention occupies an even RMS, and therefore the new frames are end stackable Thus, valuable building space is not wasted. In addition, the new CCF can accommodate an increased number of components per frame. The prior art frame (IDF) could accommodate little more than the "66" terminal block and could not accommodate the "110" terminal block as well as any of the other EIA standard 19" rack panels and components. Finally, the prior art frame did not have side wire management capability.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A frame for mounting terminal blocks and brackets comprising:

first and second spaced, parallel members, each having a U-shape and each having opposed ends;

third and fourth spaced, parallel members, each having an L-shape, said first, second, third and fourth member defining a rectangle with said third member being transversely attached to said first and second members and fourth member being transversely attached to said first and second members;

said third and fourth members each having a flat front surface and a lip extending from said front surface at about 90 degrees;

said first and second members each having a flat front surface, said surface having opposed edges and lip depending from each of said opposed edges at about 90 degrees;

said lips of said first and second members having a height equal to the lips of the third and fourth members minus the material thickness and each of said lips of said third and fourth members being flush against the respective ends of said first and second members to define each corner of the frame; and mounting holes through said first, second, third and fourth members.

2. The frame of claim 1 wherein said mounting holes include:

a plurality of first openings having a first configuration; and a plurality of second openings having a second configuration, said first and second openings being positioned on said first and second members.

3. The frame of claim 2 wherein:

said first openings are positioned along opposed, longitudinal edges of said first and second members with a first opening on one of said edges being offset or out of alignment from a first opening on the other, opposed edge of each first or second member.

4. The frame of claim 2 wherein:

said second openings are positioned along opposed longitudinal edges of said first and second members with a second opening on one of said edges being in alignment with a second opening on the other, opposed edge of each first or second member.

5. The frame of claim 3 wherein:

said second openings are positioned along opposed longitudinal edges of said first and second members with a second opening on one of said edges being in alignment with a second opening on the other, opposed edge of each first or second member.

6. The frame of claim 5 wherein:

said first openings have a smaller diameter than said second openings.

7. The frame of claim 5 wherein:

said first openings are sized and spaced to receive type "66" terminal blocks or brackets; and said second openings are sized and spaced to receive type "110" terminal blocks and brackets.

8. The frame of claim 5 wherein said mounting holes further include:

a plurality of aligned third openings in each of said third and fourth members.

9. The frame of claim 8 wherein:

said third openings are sized and spaced to conform to the dimensional requirements for an EIA standard 19 inch relay rack.

10. The frame of claim 1 including:

a key-hole shaped mounting hole at each corner of the frame.

11. The frame of claim 1 including:

a fifth member having a U-shape and dimensions corresponding to said first and second members, said fifth member parallel to, and positioned intermediately between said first and second members; and a sixth member having a L-shape and dimensions corresponding to about two times said third and fourth members mounted transversely to said first, second and fifth members to define two rectangular areas for mounting terminal blocks and brackets.

12. The frame of claim 1 including:

stand-off bracket means attachable to the corners of said frames.

13. The frame of claim 12 wherein said stand-off bracket comprises:

a rectangular one piece member having a flat front piece with four sides extending at about 90 degrees from said front face, two of said sides defining opposed side flaps and the other two of said sides defining opposed end flaps;

mounting holes through said end flaps for mounting to said frame, wall and rack; and mounting holes through said flat front for mounting vertical and side wire managers.

14. The frame of claim 13 including:

a space between said side flaps and said end flaps, said space having a dimension corresponding to about the height of said lips of said first and second members.

15. The frame of claim 1 including:

stand-off bracket means attachable to the joints of said frames.

* * * * *